United States Patent
Yang et al.

(10) Patent No.: US 9,827,616 B2
(45) Date of Patent: Nov. 28, 2017

(54) METHOD FOR IMPLEMENTING HIGH-PRECISION BACKDRILLING STUB LENGTH CONTROL

(71) Applicant: Huawei Technologies Co., Ltd., Shenzhen (CN)

(72) Inventors: Yongxing Yang, Shenzhen (CN); Jian Zhang, Shenzhen (CN); Shandang Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 394 days.

(21) Appl. No.: 14/553,942

(22) Filed: Nov. 25, 2014

(65) Prior Publication Data

US 2015/0078848 A1 Mar. 19, 2015

Related U.S. Application Data

(63) Continuation of application No. PCT/CN2014/073235, filed on Mar. 11, 2014.

(30) Foreign Application Priority Data

Aug. 28, 2013 (CN) .......................... 2013 1 0381665

(51) Int. Cl.
*B23B 35/00* (2006.01)
*B23B 49/00* (2006.01)
(Continued)

(52) U.S. Cl.
CPC .............. *B23B 49/00* (2013.01); *B23B 41/00* (2013.01); *H05K 3/429* (2013.01);
(Continued)

(58) Field of Classification Search
CPC ....... B23B 41/00; B23B 49/00; B23B 228/36; B23B 2260/128; B23B 2270/32;
(Continued)

(56) References Cited

U.S. PATENT DOCUMENTS 5,257,531 A * 11/1993 Motosugi .............. B23B 49/001
340/683
8,404,981 B2 3/2013 Buchwalter et al.
(Continued)

FOREIGN PATENT DOCUMENTS

CN 1787726 A 6/2006
CN 101009972 A 8/2007
(Continued)

*Primary Examiner* — Sunil K Singh
*Assistant Examiner* — Paul M Janeski
(74) *Attorney, Agent, or Firm* — Slater Matsil, LLP (57) ABSTRACT

The present invention relates to a PCB drilling method including: performing a drilling motion from an initial location, and generating a first electrical signal when coming into contact with a first conductive layer of the PCB, determining a first conductive location according to the first electrical signal, and obtaining first Z-coordinate information continuing to perform the drilling motion after drilling through the first conductive layer, and generating a second electrical signal when coming into contact with a second conductive layer, determining a second conductive location according to the second electrical signal, and obtaining second Z-coordinate information; continuing to perform the drilling motion and drilling through the PCB to obtain a through hole; and performing backdrilling in the location of the through hole according to a preset depth, and the preset depth is a medium thickness between the second conductive layer and the first conductive layer plus a compensation depth.

17 Claims, 5 Drawing Sheets

(51) Int. Cl.
*B23B 41/00* (2006.01)
*H05K 3/42* (2006.01)

(52) U.S. Cl.
CPC ....... *B23B 2228/36* (2013.01); *B23B 2228/41* (2013.01); *B23B 2260/128* (2013.01); *B23B 2270/32* (2013.01); *B23B 2270/48* (2013.01); *H05K 2203/0207* (2013.01); *H05K 2203/163* (2013.01); *Y10T 408/03* (2015.01); *Y10T 408/173* (2015.01)

(58) Field of Classification Search
CPC . B23B 2270/48; B23B 2228/41; B23B 35/00; H05K 3/429; H05K 2203/0207; H05K 2203/163; Y10T 408/03; Y10T 408/173
See application file for complete search history.

(56) References Cited

U.S. PATENT DOCUMENTS

| | | |
|---|---|---|
| 2005/0128672 A1 | 6/2005 | Tourne et al. |
| 2007/0184687 A1 | 8/2007 | Kanai et al. |
| 2008/0217052 A1 | 9/2008 | Matsui |
| 2008/0314625 A1 | 12/2008 | Hamada et al. |
| 2010/0025107 A1* | 2/2010 | Merkley ................ B23B 35/00 175/24 |
| 2011/0240348 A1 | 10/2011 | Lau |

FOREIGN PATENT DOCUMENTS

| | | | |
|---|---|---|---|
| CN | 101094562 A | 12/2007 | |
| CN | 101330804 A | 12/2008 | |
| CN | 102300412 A | 12/2011 | |
| CN | 102835196 A | 12/2012 | |
| CN | 102883522 A | 1/2013 | |
| CN | 102958289 A | 3/2013 | |
| CN | 103433969 A | 12/2013 | |
| EP | 0865231 A1 | 9/1998 | |
| JP | 3797205 B2 | 7/2006 | |
| JP | 4296864 B2 | 7/2009 | |
| WO | WO 2010014305 A1 * | 2/2010 | ............. B23B 35/00 |
| WO | WO 2010127496 A1 * | 11/2010 | ........... H05K 3/0047 |

* cited by examiner

METHOD FOR IMPLEMENTING HIGH-PRECISION BACKDRILLING STUB LENGTH CONTROL

This application is a continuation of International Application No. PCT/CN2014/073235, filed on Mar. 11, 2014, which claims priority to Chinese Patent Application No. 201310381665.7, filed on Aug. 28, 2013, both of which are hereby incorporated by reference in their entireties.

TECHNICAL FIELD

The present invention relates to the field of printed circuit board (Printed Circuit Board, PCB) manufacturing technologies, and in particular, to a printed circuit board drilling method and apparatus.

BACKGROUND

With rapid development of radio and network communications technologies, working frequencies of communications products are increasingly high. The higher working frequencies of the communications products impose higher requirements on loss control in a transmission process. Backdrilling of a printed circuit board is a processing manner of reducing hole link loss effectively. After backdrilling is performed, a smaller length of a redundant stub (Stub) above the signal layer means smaller loss.

In the prior art, a plated through hole (Plated Through Hole, PTH) is generally backdrilled according to a pre-calculated theoretic backdrilling depth, and a conventional backdrilling test Coupon (Coupon), which is used in manufacturing a board edge of a PCB, is performed to test a backdrilling stub length, and sectioning analysis is performed to rectify a backdrilling depth. A workload of depth detection is heavy. Generally, a Coupon backdrilling depth is detected by sectioning according to a production batch, that is, a backdrilling depth is not rectified for every PCB. Due to thickness inhomogeneity of PCBs, the thicknesses of the PCBs in a same batch vary to some extent, and even thicknesses in different locations of a same PCB vary. The disadvantages of the prior art are: a deviation exists between a backdrilling depth obtained according to a test result of a conventional backdrilling Coupon location at a board edge of a PCB and a depth in an actual backdrilling location on the PCB. With a greater thickness of the PCB, an absolute value of the deviation is larger, and the deviation of the backdrilling depth is greater.

PCB functions are increasingly complex, and the extent of integration is increasingly high. Correspondingly, a PCB needs to have more layers and a larger thickness to meet PCB function design requirements, however, a backdrilling depth obtained according to the foregoing test result of a backdrilling Coupon location at a board edge of a PCB is deviated greatly, which leads to a great stub length and causes great impact on hole link loss when a high-frequency signal is transmitted.

SUMMARY

Embodiments of the present invention provide a printed circuit board drilling method and apparatus, which can reduce loss of a hole link in a high-speed and high-frequency signal transmission process by reducing a backdrilling stub length.

According to a first aspect, an embodiment of the present invention provides a printed circuit board drilling method, where the method includes: performing, by a drill bit of a drill, a drilling motion from an initial location, and generating, by the drill, a first electrical signal when coming into contact with a first conductive layer of a printed circuit board, determining a first conductive location according to the first electrical signal, and obtaining first Z-coordinate information corresponding to the first conductive location; continuing to perform the drilling motion after drilling through the first conductive layer, and generating, by the drill, a second electrical signal when coming into contact with a second conductive layer of the printed circuit board, determining a second conductive location according to the second electrical signal, and obtaining second Z-coordinate information corresponding to the second conductive location; continuing to perform the drilling motion and drilling through the printed circuit board to obtain a through hole; and performing backdrilling in a location of the through hole according to a preset depth, where the preset depth is a medium thickness between the second conductive layer and the first conductive layer plus a compensation depth, and the medium thickness is obtained by calculating an absolute value of a difference between the first Z-coordinate information and the second Z-coordinate information.

With reference to the first aspect, in a first possible implementation manner, when the first conductive layer is a backdrill-side conductive layer and the second conductive layer is a conductive layer between a signal layer and the backdrill-side conductive layer, the continuing to perform the drilling motion and drilling through the printed circuit board to obtain a through hole, includes: after the drill bit drills through the second conductive layer, continuing the drilling motion until the printed circuit board is drilled through, so that the through hole can obtained; and when the first conductive layer is the conductive layer between the signal layer and the backdrill-side conductive layer and the second conductive layer is the backdrill-side conductive layer, the continuing to perform the drilling motion and drilling through the printed circuit board to obtain a through hole, includes: stopping the drilling motion after the drill bit drills through the second conductive layer, so that the through hole can be obtained.

With reference to the first aspect or the first possible implementation manner of the first aspect, in a second possible implementation manner, the first Z-coordinate information and the second Z-coordinate information identify coordinate values of the drill bit in a vertical direction.

With reference to the first aspect or the first and second possible implementation manners of the first aspect, in a third possible implementation manner, the generating, by the drill, a first electrical signal when coming into contact with a first conductive layer of the printed circuit board, includes: when the drill bit comes into contact with the first conductive layer of the printed circuit board, detecting, by the drill by using an internal sensor, that a first loop is formed among the first conductive layer, a control circuit of the drill, and the drill bit, and generating the first electrical signal.

With reference to the first aspect or the first, second, and third possible implementation manners of the first aspect, in a fourth possible implementation manner, the generating, by the drill, a second electrical signal when contacting a second conductive layer of the printed circuit board, includes: when the drill bit comes into contact with the second conductive layer of the printed circuit board, detecting, by the drill by using the internal sensor, that a second loop is formed among the second conductive layer, a control circuit of the drill, and the drill bit, and generating the second electrical signal.

According to a second aspect, an embodiment of the present invention provides a printed circuit board drilling apparatus, where the apparatus includes a main body and a drill bit, where: the main body includes a controller, and the controller includes a control circuit and a sensor; the control circuit controls the drill bit to perform a drilling motion from an initial location, and the drill generates a first electrical signal when coming into contact with a first conductive layer of the printed circuit board, determines a first conductive location according to the first electrical signal, and obtains first Z-coordinate information corresponding to the first conductive location; the control circuit controls the drill bit to continue to perform the drilling motion after the drill bit drills through the first conductive layer, and the drill generates a second electrical signal when coming into contact with a second conductive layer of the printed circuit board, determines a second conductive location according to the second electrical signal, and obtains second Z-coordinate information corresponding to the second conductive location; and the control circuit controls the drill bit to continue to perform the drilling motion, drill through the printed circuit board, and obtain a through hole; and the main body performs backdrilling in a location of the through hole according to a preset depth, where the preset depth is a medium thickness between the second conductive layer and the first conductive layer plus a compensation depth, and the medium thickness is obtained by calculating an absolute value of a difference between the first Z-coordinate information and the second Z-coordinate information.

With reference to the second aspect, in a first possible implementation manner, when the first conductive layer is a backdrill-side conductive layer and the second conductive layer is a conductive layer between a signal layer and the backdrill-side conductive layer, the drill bit is specifically configured to: after the drill bit drills through the second conductive layer, continue the drilling motion until the printed circuit board is drilled through, so that the through hole can be obtained; and when the first conductive layer is the conductive layer between the signal layer and the backdrill-side conductive layer and the second conductive layer is the backdrill-side conductive layer, the drill bit is specifically configured to: stop the drilling motion after the drill bit drills through the second conductive layer, so that the through hole can be obtained.

With reference to the second aspect or the first possible implementation manner of the second aspect, in a second possible implementation manner, the first Z-coordinate information and the second Z-coordinate information identify coordinate values of the drill bit in a vertical direction.

With reference to the second aspect or the first and second possible implementation manners of the second aspect, in a third possible implementation manner, a process of generating the second electrical signal by the drill when the drill bit comes into contact with the first conductive layer of the printed circuit board is specifically: when the drill bit comes into contact with the first conductive layer of the printed circuit board, detecting, by the sensor, that a first loop is formed among the first conductive layer, the control circuit of the drill, and the drill bit; and generating, by the drill, the first electrical signal according to the first loop.

With reference to the second aspect or the first, second, and third possible implementation manners of the second aspect, in a fourth possible implementation manner, a process of generating the second electrical signal by the drill when coming into contact with the second conductive layer of the printed circuit board is specifically: when the drill bit comes into contact with the second conductive layer of the printed circuit board, detecting, by the sensor, that a second loop is formed among the second conductive layer, the control circuit of the drill, and the drill bit; and generating, by the drill, the second electrical signal according to the second loop.

In the embodiments of the present invention, when backdrilling needs to be performed on a printed circuit board, a drill bit of a drill performs a drilling motion from an initial location, and the drill generates a first electrical signal when coming into contact with a first conductive layer of the printed circuit board, determines a first conductive location according to the first electrical signal, and obtains first Z-coordinate information corresponding to the first conductive location; the drilling motion continues after the first conductive layer is drilled through, and the drill generates a second electrical signal when coming into contact with a second conductive layer of the printed circuit board, determines a second conductive location according to the second electrical signal, and obtains second Z-coordinate information corresponding to the second conductive location; the drilling motion continues, the printed circuit board is drilled through, and a through hole is obtained; and backdrilling is performed in a location of the through hole according to a preset depth, where the preset depth is a medium thickness between the second conductive layer and the first conductive layer plus a compensation depth, and the medium thickness is obtained by calculating an absolute value of a difference between the first Z-coordinate information and the second Z-coordinate information. Therefore, in the embodiments of the present invention, when a through hole is drilled, a precise backdrilling depth of the to-be-backdrilled through hole is obtained by acquiring a medium thickness between the second conductive layer and the first conductive layer to reduce a backdrilling stub length, implementing high-precision backdrilling on the PCB, thereby reducing loss of a hole link in a high-speed and high-frequency signal transmission process, and improving integrity of a transmitted signal.

DETAILED DESCRIPTION OF ILLUSTRATIVE EMBODIMENTS

The following clearly describes the solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
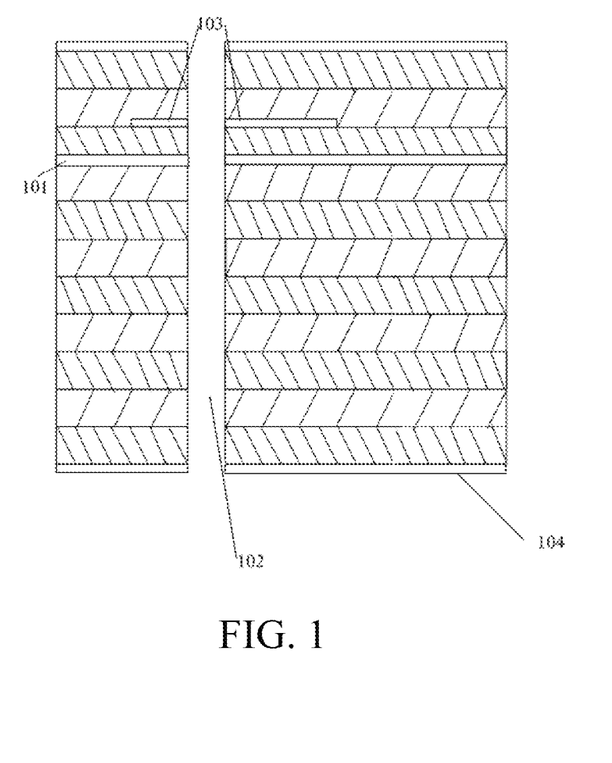
FIG. 1 is a schematic cross-section diagram of a printed circuit board according to an embodiment of the present invention.

The following uses FIG. 1 as an example to describe in detail a printed circuit board provided in an embodiment of the present invention. FIG. 1 is a schematic cross-section diagram of a printed circuit board according to an embodiment of the present invention. To control a backdrilling depth precisely, the drilling method provided in this embodiment of the present invention needs to acquire a medium thickness between a first conductive layer and a second conductive layer. To generate an electrical signal when a drill bit comes into contact with the first conductive layer or the second conductive layer during drilling of a through hole, the first conductive layer and the second conductive layer that can combine with a control circuit of a drill and the drill bit to form a circuit loop need to be arranged in the printed circuit board.

As shown in FIG. 1, the printed circuit board provided in this embodiment of the present invention includes a first conductive layer 101, a through hole 102, a signal layer 103, and a second conductive layer 104. It should be noted that in this embodiment and all subsequent embodiments, no strict location relationship exists between the first conductive layer and the second conductive layer, and the first conductive layer and the second conductive layer merely represent two different conductive layers. Therefore, in the schematic diagram in FIG. 1, the names of the two are interchangeable. For example, 104 in FIG. 1 is considered as "the first conductive layer", and 101 in FIG. 1 is considered as "the second conductive layer".

Parts of the printed circuit board are specifically as follows:

The signal layer 103: The signal layer may, by means of design (for example, by arranging an insulation medium between the signal layer and the drill), prevent generating a current when the drill drills to the signal layer, where the current is used to provide feedback about the forming of a loop.

The first conductive layer 101: The first conductive layer is located between the signal layer 103 and the second conductive layer 104.

Optionally, the first conductive layer 101 is a power layer or a ground layer.

The first conductive layer 101 is a necessarily to-be-drilled-through layer during backdrilling. When a through hole is drilled, the first conductive layer 104, a drill bit for drilling the through hole, and a control circuit of the drill may form a first test circuit loop, which enables the drill to obtain an electrical signal and determine a location of the first conductive layer.

The through hole 102: A third conductive layer is formed on an inner wall of the through hole.

The third conductive layer formed on the inner wall of the through hole 102 may be connected to the signal layer and an upper end surface (the other side opposite to a backdrilling side) of the printed circuit board.

The second conductive layer 104: The second conductive layer is located on the backdrilling side (that is, the side that comes into contact with the drill bit first).

The first conductive layer, the drill bit for drilling the through hole, and the control circuit of the drill form a first test circuit loop, which enables the drill to acquire an electrical signal and determine the location of the first conductive layer; and the second conductive layer, the drill bit for drilling the through hole, and the control circuit of the drill form a second test circuit loop, which enables the drill to acquire an electrical signal and determine the location of the second conductive layer.

Optionally, the second conductive layer 104 is a backdrill-side conductive layer. When a through hole is drilled, the drilling may start from the backdrill-side conductive layer, that is, the second conductive layer 104. In this way, when the drill bit comes into contact with the second conductive layer 104, the second conductive layer 104, the drill bit, and the control circuit of the drill form the second test loop to generate an electrical signal. The location of the second conductive layer 104 can be determined by using the electrical signal. The drilling motion continues. When the drilling reaches the first conductive layer 101, the first conductive layer 101, the drill bit, and the control circuit of the drill form the first test loop to generate an electrical signal. The location of the first conductive layer 101 can be determined by using the electrical signal. By determining the location of the first conductive layer 101 and the second conductive layer 104, a medium thickness between the two conductive layers can be determined, and backdrilling can be performed according to the medium thickness.

Optionally, multiple signal layers and an insulation layer that separates the multiple signal layers may be included between the second conductive layer 104 and the first conductive layer 101. Insulation processing of arranging an isolation pad on each layer between the second conductive layer 104 and the first conductive layer 101 may be performed to prevent generating a circuit loop when the drill bit reaches each layer between the second conductive layer 104 and the first conductive layer 101, where the circuit loop causes impact on determination of the location of the first conductive layer 101.

Optionally, when a through hole is drilled, the drilling may start from a side opposite to the backdrill-side conductive layer. In this way, the drilling may reach the signal layer first, and then reach the first conductive layer 101, and then reach the second conductive layer 104, that is, the backdrill-side conductive layer. When the drill bit comes into contact with the first conductive layer 101, the first conductive layer 101, the drill bit, and the control circuit of the drill form the first test loop to generate an electrical signal. The location of the first conductive layer 101 can be determined by using the electrical signal. The drilling motion continues. When the drilling reaches the second conductive layer 104, the second conductive layer 104, the drill bit, and the control circuit of the drill form a second test loop to generate an electrical signal. The location of the second conductive layer 104 can be determined by using the electrical signal. By determining the locations of the first conductive layer 101 and the second conductive layer 104, a medium thickness between the two conductive layers can be determined.

After the medium thickness between the conductive layers is determined, a compensation value (an offset value) may be added on the basis of the thickness to serve as a depth for backdrilling to implement high-precision backdrilling.

Therefore, in the printed circuit board provided in this embodiment of the present invention, by arranging a first conductive layer on a necessarily to-be-drilled-through layer and arranging a second conductive layer on a backdrilling side, locations of the second conductive layer and the first conductive layer are confirmed when a through hole is drilled, so as to acquire a precise depth between the two conductive layers, and further, a required backdrilling depth is determined based on the depth and a compensation value, thereby implementing high-precision backdrilling, controlling a smaller stub, reducing loss of a hole link in a high-speed and high-frequency signal transmission process, and improving integrity of a transmitted signal.

Figure 2:
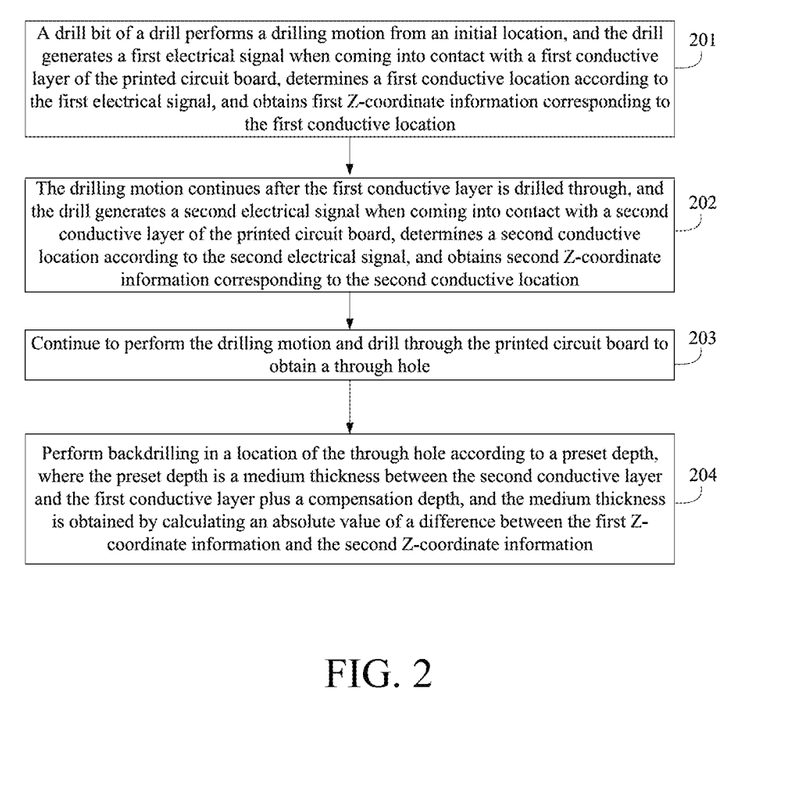
FIG. 2 is a flowchart of a printed circuit board drilling method according to an embodiment of the present invention.

The foregoing embodiment has described a printed circuit board provided in the embodiments of the present invention, and the following describes a drilling method for the printed circuit board by using an embodiment. FIG. 2 is a flowchart of a printed circuit board drilling method according to an embodiment of the present invention. This embodiment is implemented by a drill. In this embodiment, a method for determining a backdrilling depth when a drill drills a through hole is described in detail. As shown in FIG. 2, this embodiment includes the following steps:

Step 201: A drill bit of a drill performs a drilling motion from an initial location, and the drill generates a first electrical signal when coming into contact with a first conductive layer of the printed circuit board, determines a first conductive location according to the first electrical signal, and obtains first Z-coordinate information corresponding to the first conductive location.

The drill may start drilling a through hole from a backdrill-side conductive layer, or may start drilling the through hole from the other side of the printed circuit board, where the other side is opposite to the backdrill-side conductive layer. By using an example that the drill starts drilling the through hole from the backdrill-side conductive layer, this embodiment of the present invention describes in detail technical solutions provided in this embodiment of the present invention. Certainly, the technical solutions provided in this embodiment of the present invention are also completely applicable to an application scenario in which the drilling of the through hole starts from the other side of the printed circuit board, where the other side is opposite to the backdrill-side conductive layer.

When the drill starts to drill the through hole from the backdrill-side conductive layer, the first conductive layer is the backdrill-side conductive layer, and the second conductive layer is a conductive layer between a signal layer and the backdrill-side conductive layer. Specifically, the initial location is a location from which the drill bit starts the drilling motion. When drilling the printed circuit board, the drill controls the drill bit to start the drilling motion from the initial location. When the drill bit comes into contact with the first conductive layer of the printed circuit board, a first loop is formed among the first conductive layer, a control circuit of the drill, and the drill bit to generate a first electrical signal. At this time, the drill acquires the location of the drill bit as the first conductive location, and may record Z-coordinate (vertical coordinate) information corresponding to the first conductive location, where the Z-coordinate information may identify real coordinate information of the drill bit in a vertical direction.

Optionally, the first Z-coordinate information may also identify reference coordinate information (such as 0) of a real location of the drill bit relative to the initial location in a vertical direction, or may be reference coordinate information (such as 1000, −100, and the like) that uses any value as a reference value.

Step 202: The drilling motion continues after the first conductive layer is drilled through, and the drill generates a second electrical signal when coming into contact with a second conductive layer of the printed circuit board, determines a second conductive location according to the second electrical signal, and obtains second Z-coordinate information corresponding to the second conductive location.

After the first conductive location is acquired, the drill controls the drill bit to continue to perform the drilling motion in a same location. When the drilling proceeds to some extent, the drill bit comes into contact with the second conductive layer of the printed circuit board. At this time, the second conductive layer, the control circuit of the drill, and the drill bit may form a second loop by using the printed circuit board to generate a second electrical signal, and the drill imports a current by using the second loop. At this time, the drill acquires the location of the drill bit as the second conductive location, and may record Z-coordinate information corresponding to the second conductive location, where the Z-coordinate information may identify coordinate information of a real location of the drill bit in a vertical direction.

The second Z-coordinate information is used to calculate a distance of movement of the drill bit in a Z direction (a vertical direction) (that is, calculate an offset distance). Therefore, a value of the second Z-coordinate information corresponds to that of the first Z-coordinate information. For example, when the first Z-coordinate information is a relatively real (some errors exist in the system) Z-coordinate value, the second Z-coordinate information is also a relatively real Z-coordinate value; and, when the first Z-coordinate information is a relative value (such as 0), a value of the second Z-coordinate information is an offset obtained by counting from 0.

Step 203: Continue to perform the drilling motion, drill through the printed circuit board, and obtain a through hole.

Specifically, after drilling through the first conductive layer, the drill bit continues the drilling motion, and a through hole is obtained when the printed circuit board is drilled through. The inner wall of the through hole may be copper-plated to obtain a third conductive layer. The third conductive layer is used to connect the signal layer and an upper end surface of the printed circuit board (the other end side, which is opposite to the second conductive layer, of the printed circuit board).

Step 204: Perform backdrilling in a location of the through hole according to a preset depth, where the preset depth is a medium thickness between the second conductive layer and the first conductive layer plus a compensation depth, and the medium thickness is obtained by calculating an absolute value of a difference between the first Z-coordinate information and the second Z-coordinate information.

After obtaining the first Z-coordinate information and the second Z-coordinate information, the drill may automatically calculate the medium thickness between the second conductive layer and the first conductive layer by using an internal configured program, where the medium thickness may be a backdrilling depth during backdrilling.

Figure 3:
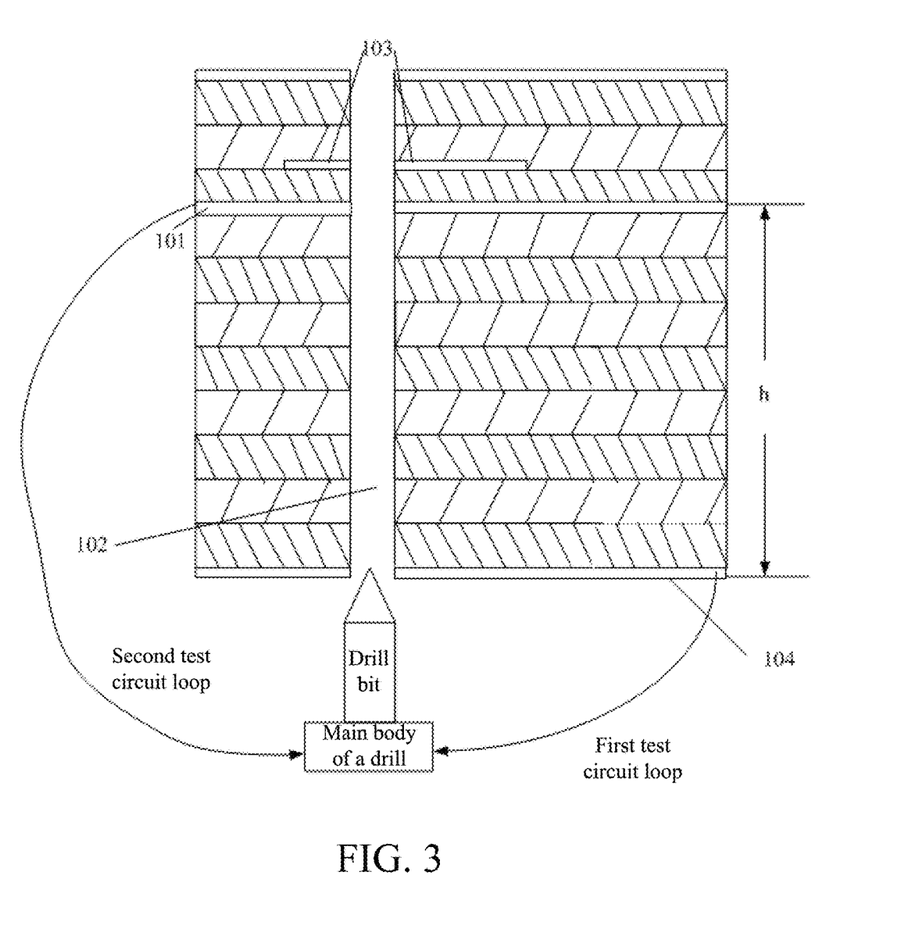
FIG. 3 is a schematic diagram of acquiring a medium thickness between a second conductive layer and a first conductive layer by using a current feedback signal according to an embodiment of the present invention.

FIG. 3 is a schematic diagram of obtaining a medium thickness between a second conductive layer and a first conductive layer by using a current feedback signal according to an embodiment of the present invention. As shown in the figure, when a drill bit reaches a backdrill-side conductive layer, a control circuit in a main body of a drill, the drill bit, and the backdrill-side conductive layer form a test circuit loop. At this time, the main body of the drill may acquire the first Z-coordinate information of the drill bit. When the drill bit reaches a conductive layer between the backdrill-side conductive layer and a signal layer, the control circuit in the main body of the drill, the drill bit, and the conductive layer form a test circuit loop. At this time, the main body of the drill may acquire the second Z-coordinate information of the drill bit. By using the first Z-coordinate information and the second Z-coordinate information, a medium thickness h between the 101 conductive layer and the 104 conductive layer may be acquired.

Certainly, to acquire a backdrilling depth of higher precision, the drill may perform compensation processing on the basis of the medium thickness, that is, add a compensation depth on the basis of the medium thickness, where the compensation depth value may be a positive value or may be a negative value. The backdrilling depth ensures that a non-drillable-through layer, that is, the signal layer, cannot be drilled at the time of backdrilling. The compensation depth is set by the drill according to actual conditions, so as to ensure that the non-drillable-through layer cannot be drilled at the time of backdrilling. In a preferred embodiment, the compensation depth may be not greater than a value of subtracting a device tolerance from the medium thickness between the signal layer and a neighboring conductive layer, where the "neighboring conductive layer" refers to either the first conductive layer or the second conductive layer, whichever is closest to the signal layer, such as the conductive layer 101 in FIG. 1 and FIG. 3.

Figure 4:
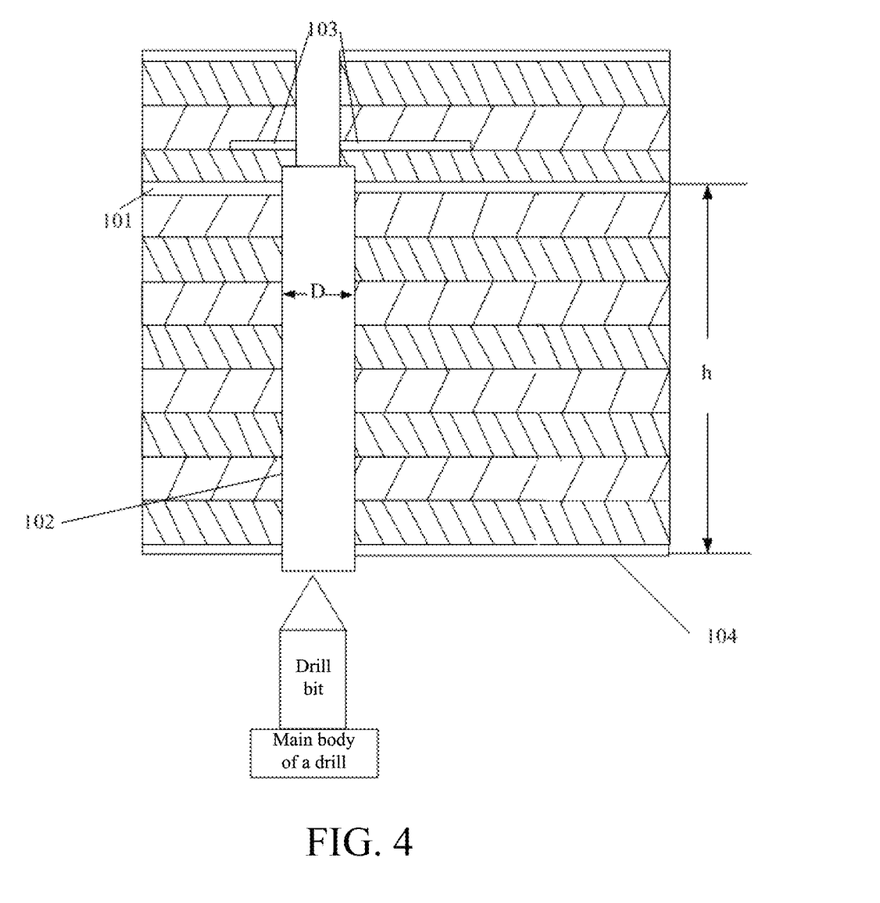
FIG. 4 is a schematic diagram of performing backdrilling according to an acquired backdrilling depth according to an embodiment of the present invention.

FIG. 4 is a schematic diagram of performing backdrilling according to an acquired backdrilling depth according to an embodiment of the present invention. After compensation processing, a backdrilling depth is obtained. That is, after a depth is preset, a through hole that needs to be backdrilled is backdrilled. An aperture D of the backdrilling is greater than the aperture of the through hole, so as to grind off the copper plating on a wall of the through hole. Because the backdrilling depth is obtained at the time of drilling the through hole and an error of the backdrilling depth is very small, the stub length of backdrilling is very small, thereby significantly reducing loss of a hole link in a high-speed and high-frequency signal transmission process and improving integrity of a transmitted high-frequency signal.

The foregoing solution is described by assuming that the drilling of the through hole starts from the backdrill-side conductive layer. Preferably, in technical solutions provided in the present invention, drilling the through hole may also be started from the other side opposite to the backdrill-side conductive layer. In this way, the drill bit reaches the signal layer first, at which time no current feedback signal is generated, and then the drilling motion continues. When the drilling reaches the 101 conductive layer shown in FIG. 1, a first test circuit loop is generated, and a first signal is generated. Therefore, the main body of the drill can determine the location of the 101 conductive layer, and the drill performs drilling motion. When the drill bit reaches the 104 conductive layer shown in FIG. 1, a second test circuit loop is generated, and a second electrical signal is generated. Therefore, the main body of the drill can determine the location of the 104 conductive layer, and a through hole is obtained after the 104 conductive layer is drilled through. According to locations of the 104 conductive layer and the 101 conductive layer, a medium thickness between the two conductive layers can be determined, and thereby, a preset depth in the location of the through hole can be determined.

Therefore, in this embodiment of the present invention, when backdrilling needs to be performed on a printed circuit board, a drill bit of a drill performs a drilling motion from an initial location, and the drill generates a first electrical signal when coming into contact with a first conductive layer of the printed circuit board, determines a first conductive location according to the first electrical signal, and obtains first Z-coordinate information corresponding to the first conductive location; the drilling motion continues after the first conductive layer is drilled through, and the drill generates a second electrical signal when coming into contact with a second conductive layer of the printed circuit board, determines a second conductive location according to the second electrical signal, and obtains second Z-coordinate information corresponding to the second conductive location; the drilling motion continues, the printed circuit board is drilled through, and a through hole is obtained; and backdrilling is performed in a location of the through hole according to a preset depth, where the preset depth is a medium thickness between the second conductive layer and the first conductive layer plus a compensation depth, and the medium thickness is obtained by calculating an absolute value of a difference between the first Z-coordinate information and the second Z-coordinate information. Therefore, in this embodiments of the present invention, when a through hole is drilled, a precise backdrilling depth of a to-be-backdrilled through hole is acquired by acquiring a medium thickness between the second conductive layer and the first conductive layer, thereby reducing the backdrilling stub length, implementing high-precision backdrilling on the PCB, reducing loss of a hole link in a high-speed and high-frequency signal transmission process, and improving integrity of a transmitted signal.

Figure 5:
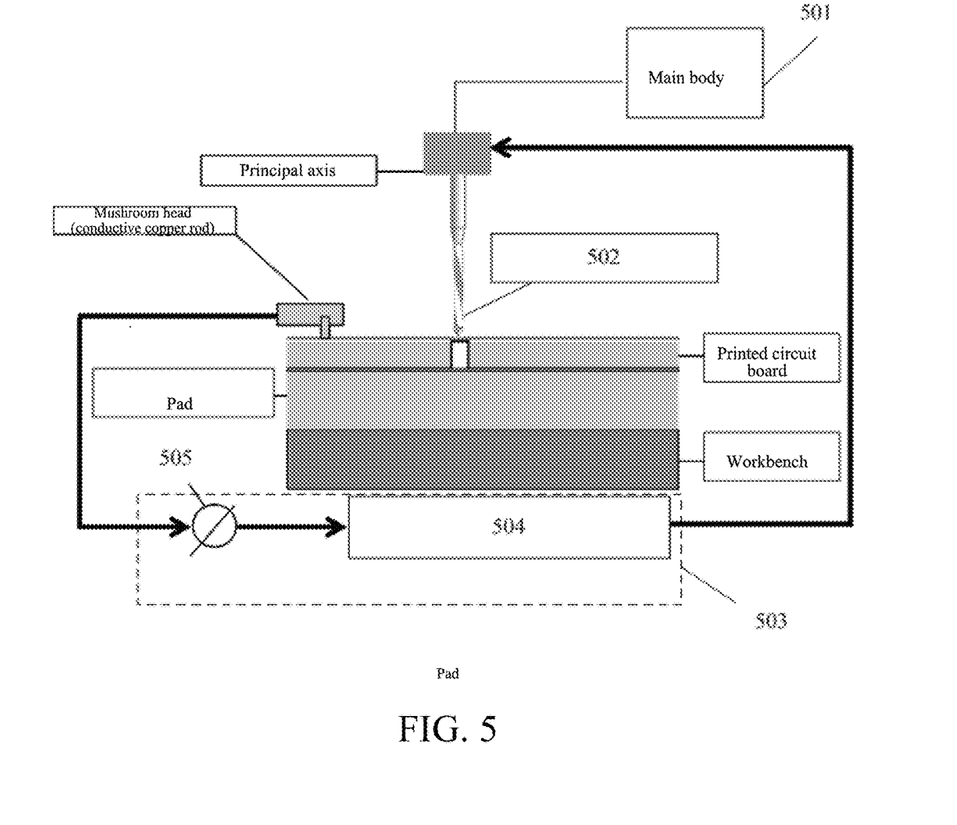
FIG. 5 is a schematic diagram of a printed circuit board drilling apparatus according to an embodiment of the present invention.

Based on all the foregoing embodiments, correspondingly, an embodiment of the present invention further provides a printed circuit board drilling apparatus. The apparatus is configured to drill a hole in a printed circuit board, where the printed circuit board includes multiple conductive layers and an insulation layer that separates the conductive layers. FIG. 5 is a schematic diagram of a printed circuit board drilling apparatus according to an embodiment of the present invention. As shown in FIG. 5, the apparatus includes a main body 501 and a drill bit 502. The main body 501 includes a controller 503, and the controller 503 includes a control circuit 504 and a sensor 505.

The main body 501 includes the controller 503, and the controller 503 includes the control circuit 504 and the sensor 505; the control circuit controls the drill bit to perform a drilling motion from an initial location, and the drill generates a first electrical signal when coming into contact with a first conductive layer of the printed circuit board, determines a first conductive location according to the first electrical signal, and obtains first Z-coordinate information corresponding to the first conductive location; the control circuit controls the drill bit to continue to perform the drilling motion after the drill bit drills through the first conductive layer, and the drill generates a second electrical signal when coming into contact with a second conductive layer of the printed circuit board, determines a second conductive location according to the second electrical signal, and obtains second Z-coordinate information corresponding to the second conductive location; and the control circuit controls the drill bit to continue to perform the drilling motion, drill through the printed circuit board, and obtain a through hole.

When the first conductive layer is a backdrill-side conductive layer and the second conductive layer is a conductive layer between a signal layer and the backdrill-side conductive layer, the drill bit is specifically configured to: after the drill bit drills through the second conductive layer, continue the drilling motion until the printed circuit board is drilled through, so that the through hole can be obtained; and when the first conductive layer is the conductive layer between the signal layer and the backdrill-side conductive layer and the second conductive layer is the backdrill-side conductive layer, the drill bit is specifically configured to: stop the drilling motion after the drill bit drills through the second conductive layer, so that the through hole can be obtained.

The first Z-coordinate information and the second Z-coordinate information identify coordinate values of the drill bit in a vertical direction.

Specifically, the initial location is a location from which the drill bit starts the drill-down motion. When drilling the printed circuit board, the drill controls the drill bit to start the drilling motion from the initial location. When the drill bit comes into contact with the first conductive layer, the sensor 505 detects that a first loop is formed among the first conductive layer, the control circuit of the drill, and the drill bit, and the drill generates a first electrical signal. At this time, the drill may determine a first conductive location according to the first electrical signal, and may record Z-coordinate information corresponding to the first conductive location, where the Z-coordinate information may identify coordinate information of a real location of the drill bit in the vertical direction.

After the main body 501 acquires the first conductive location, the drill controls the drill bit to continue to perform the drilling motion in a same location. When the drilling proceeds to some extent, the drill bit comes into contact with the second conductive layer of the printed circuit board. At this time, the sensor 505 detects that the second conductive layer, the control circuit of the drill, and the drill bit form a second loop by using the printed circuit board, and the drill generates a second electrical signal, and the drill imports a current by using the second loop. At this time, the drill acquires the location of the drill bit as the second conductive location, and may record Z-coordinate information corresponding to the second conductive location, where the Z-coordinate information may identify coordinate information of a real location of the drill bit in the vertical direction.

Specifically, after drilling through the first conductive layer, the drill bit 502 continues the drilling motion, and the through hole is obtained when the printed circuit board is drilled through. After the through hole is obtained, the through hole may be electroplated to form a conductive layer inside the through hole.

The main body 501: The main body performs backdrilling in a location of the through hole according to a preset depth, where the preset depth is a medium thickness between the second conductive layer and the first conductive layer plus a compensation depth, and the medium thickness is obtained by calculating an absolute value of a difference between the first Z-coordinate information and the second Z-coordinate information.

After acquiring the first Z-coordinate information and the second Z-coordinate information, the main body 501 may automatically calculate a medium thickness between the second conductive layer in the location of the through hole and the first conductive layer by using an internal configured program, where the medium thickness may be a backdrilling depth during backdrilling.

Certainly, to acquire a backdrilling depth of higher precision, the main body 502 may perform compensation processing on the basis of the medium thickness, that is, add a compensation depth on the basis of the medium thickness, where the compensation depth value may be a positive value or may be a negative value. The compensation depth is set by the drill according to actual conditions, so as to ensure that the non-drillable-through layer cannot be drilled at the time of backdrilling.

After the compensation processing, the preset depth, that is, the backdrilling depth, is obtained. Then, the through hole that needs to be backdrilled is backdrilled. An aperture of the backdrilling is greater than the aperture of the through hole, so as to grind off the copper plating on a wall of the through hole. Because the backdrilling depth is obtained at the time of drilling the through hole and an error of the backdrilling depth is very small, the stub length of backdrilling is very small, thereby significantly reducing loss of a hole link in a high-speed and high-frequency signal transmission process and improving integrity of a transmitted high-frequency signal.

It should be noted that the drill may start drilling the through hole from the backdrill-side conductive layer or start drilling the through hole from the other side, which is opposite to the backdrill-side conductive layer, of the printed circuit board. The drilling apparatus provided in this embodiment of the present invention is applicable to both of the scenarios.

Therefore, in the embodiments of the present invention, when a through hole is drilled, a precise backdrilling depth is acquired by obtaining a medium thickness between a second conductive layer and a first conductive layer (a necessarily to-be-drilled-through layer), thereby reducing the backdrilling stub length, implementing high-precision backdrilling on the PCB, reducing loss of a hole link in a high-speed and high-frequency signal transmission process, and improving integrity of transmitted signals.

A person skilled in the art may be further aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

In combination with the embodiments disclosed in this specification, method or algorithm steps may be implemented by hardware, a software module executed by a processor, or a combination thereof. The software module may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

The foregoing specific embodiments clarify the objective, technical solutions, and benefits of the present invention in detail. It should be understood that the foregoing descriptions are merely specific embodiments of the present invention, but are not intended to limit the protection scope of the present invention. Any modification, equivalent replacement, or improvement made without departing from the spirit and principle of the present invention should fall within the protection scope of the present invention.

What is claimed is:

1. A printed circuit board drilling method comprising:
   in a process of drilling a through hole, performing the following:
   controlling, by a drill, a drill bit to perform a drilling motion from an initial location;
   generating, by the drill, a first electrical signal when the drill bit comes into contact with a first conductive layer of a printed circuit board;
   determining a first conductive location according to the first electrical signal;

obtaining a first Z-coordinate information corresponding to the first conductive location;
continuing to control the drill bit to perform the drilling motion after drilling through the first conductive layer;
generating, by the drill, a second electrical signal when the drill bit comes into contact with a second conductive layer of the printed circuit board;
determining a second conductive location according to the second electrical signal;
obtaining a second Z-coordinate information corresponding to the second conductive location; and
continuing to control the drill bit to perform the drilling motion until the drill bit drills through the printed circuit board to obtain a the through hole; and
after forming the through hole, performing the following:
controlling the drill bit to perform a backdrilling motion in a location of the through hole according to a preset depth, wherein the preset depth is a medium thickness between the second conductive layer and the first conductive layer plus a compensation depth, and wherein the medium thickness is obtained by calculating an absolute value of a difference between the first Z-coordinate information and the second Z-coordinate information.

2. The printed circuit board drilling method according to claim 1, wherein, when the first conductive layer is a backdrill-side conductive layer and the second conductive layer is a conductive layer between a signal layer and the backdrill-side conductive layer, controlling the drill bit to continue to perform the drilling motion until the drill bit drills through the printed circuit board to obtain the through hole comprises: after the drill bit drills through the second conductive layer, continuing to control the drill bit to perform the drilling motion until the printed circuit board is drilled through and the through hole is obtained, and wherein, when the first conductive layer is the conductive layer between the signal layer and the backdrill-side conductive layer and the second conductive layer is the backdrill-side conductive layer, controlling the drill bit to continue to perform the drilling motion until the drill bit drills through the printed circuit board to obtain the through hole comprises: stopping the drilling motion after the drill bit drills through the second conductive layer and the through hole is obtained.

3. The printed circuit board drilling method according to claim 2, wherein the first Z-coordinate information and the second Z-coordinate information identify coordinate values of the drill bit in a vertical direction.

4. The printed circuit board drilling method according to claim 2, wherein generating the first electrical signal when the drill bit comes into contact with the first conductive layer of the printed circuit board comprises:
when the drill bit comes into contact with the first conductive layer of the printed circuit board, detecting, by the drill using an internal sensor, that a first loop is formed among the first conductive layer, a control circuit of the drill, and the drill bit; and
generating the first electrical signal.

5. The printed circuit board drilling method according to claim 2, wherein generating the second electrical signal when the drill bit comes into contact with the second conductive layer of the printed circuit board comprises:
when the drill bit comes into contact with the second conductive layer of the printed circuit board, detecting, by the drill using an internal sensor, that a second loop is formed among the second conductive layer, a control circuit of the drill, and the drill bit; and
generating the second electrical signal.

6. The printed circuit board drilling method according to claim 1, wherein the first Z-coordinate information and the second Z-coordinate information identify coordinate values of the drill bit in a vertical direction.

7. The printed circuit board drilling method according to claim 1, wherein generating the first electrical signal when the drill bit comes into contact with the first conductive layer of the printed circuit board comprises:
when the drill bit comes into contact with the first conductive layer of the printed circuit board, detecting, by the drill using an internal sensor, that a first loop is formed among the first conductive layer, a control circuit of the drill, and the drill bit; and
generating the first electrical signal.

8. The printed circuit board drilling method according to claim 1, wherein generating the second electrical signal when the drill bit comes into contact with the second conductive layer of the printed circuit board comprises:
when the drill bit comes into contact with the second conductive layer of the printed circuit board, detecting, by the drill using an internal sensor, that a second loop is formed among the second conductive layer, a control circuit of the drill, and the drill bit; and
generating the second electrical signal.

9. A printed circuit board drilling apparatus configured to drill a through hole on a printed circuit board, the printed circuit board drilling apparatus comprising:
a drill coupled to a drill bit, the drill comprising a main body that includes a control circuit and a sensor, wherein the control circuit is configured to control the drill bit to perform a drilling motion from an initial location,
wherein the drill is configured to, while drilling the through hole, perform the following:
generate a first electrical signal when coming into contact with a first conductive layer of the printed circuit board, to determine a first conductive location according to the first electrical signal, and to obtain a first Z-coordinate information corresponding to the first conductive location;
control the drill bit to continue performing the drilling motion after the drill bit drills through the first conductive layer, to generate a second electrical signal when the drill bit comes into contact with a second conductive layer of the printed circuit board, to determine a second conductive location according to the second electrical signal, to obtain a second Z-coordinate information corresponding to the second conductive location;
control the drill bit to continue performing the drilling motion until the drill bit drills through the printed circuit board and obtains the through hole; and
wherein the drill is further configured to, after drilling the through hole, perform the following:
control the drill bit to perform backdrilling in a location of the through hole according to a preset depth,
wherein the preset depth is a medium thickness between the second conductive layer and the first conductive layer plus a compensation depth, and
wherein the medium thickness is obtained by calculating an absolute value of a difference between the first Z-coordinate information and the second Z-coordinate information.

10. The printed circuit board drilling apparatus according to claim 9, wherein, when the first conductive layer is a backdrill-side conductive layer and the second conductive layer is a conductive layer between a signal layer and the backdrill-side conductive layer, the drill is further configured to: after the drill bit drills through the second conductive layer, control the drill bit to continue the drilling motion until the drill bit drills through the printed circuit board to obtain the through hole; and when the first conductive layer is the conductive layer between the signal layer and the backdrill-side conductive layer and the second conductive layer is the backdrill-side conductive layer, the drill is further configured to: stop the drilling motion after the drill bit drills through the second conductive layer and the through hole is obtained.

11. The printed circuit board drilling apparatus according to claim 10, wherein the first Z-coordinate information and the second Z-coordinate information identify coordinate values of the drill bit in a vertical direction.

12. The printed circuit board drilling apparatus according to claim 10, wherein generating the second electrical signal when the drill bit comes into contact with the first conductive layer of the printed circuit board comprises:

when the drill bit comes into contact with the first conductive layer of the printed circuit board, detecting, by the sensor, that a first loop is formed among the first conductive layer, the control circuit of the drill, and the drill bit; and generating, by the drill, the first electrical signal according to the first loop.

13. The printed circuit board drilling apparatus according to claim 10, wherein generating the second electrical signal when the drill bit comes into contact with the second conductive layer of the printed circuit board comprises:

when the drill bit comes into contact with the second conductive layer of the printed circuit board, detecting, by the sensor, that a second loop is formed among the second conductive layer, the control circuit of the drill, and the drill bit; and generating, by the drill, the second electrical signal according to the second loop.

14. The printed circuit board drilling apparatus according to claim 9, wherein the first Z-coordinate information and the second Z-coordinate information identify coordinate values of the drill bit in a vertical direction.

15. The printed circuit board drilling apparatus according to claim 9, wherein generating the second electrical signal when the drill bit comes into contact with the first conductive layer of the printed circuit board comprise:

when the drill bit comes into contact with the first conductive layer of the printed circuit board, detecting, by the sensor, that a first loop is formed among the first conductive layer, the control circuit of the drill, and the drill bit; and generating, by the drill, the first electrical signal according to the first loop.

16. The printed circuit board drilling apparatus according to claim 9, wherein, a process of generating the second electrical signal by the drill when coming into contact with the second conductive layer of the printed circuit board is specifically: when the drill bit comes into contact with the second conductive layer of the printed circuit board, detecting, by the sensor, that a second loop is formed among the second conductive layer, the control circuit of the drill, and the drill bit; and generating, by the drill, the second electrical signal according to the second loop.

17. A printed circuit board drilling apparatus configured to drill a through hole extending through a printed circuit board, the printed circuit board drilling apparatus comprising:

a drill coupled to a drill bit, the drill comprising a main body that includes a control circuit and a sensor, wherein the control circuit is configured to control the drill bit to perform a drilling motion from an initial location, wherein the drill is configured to, in a process of forming the through hole, perform the following:

in response to coming into contact with a first conductive layer of the printed circuit board, generate a first electrical signal to determine a first conductive location according to the first electrical signal, and to obtain a first Z-coordinate information corresponding to the first conductive location, wherein the first electrical signal is generated by an electrical circuit formed by the first conductive layer, the control circuit of the drill, and the drill bit;

control the drill bit to continue performing the drilling motion after the drill bit drills through the first conductive layer, to generate a second electrical signal when the drill bit comes into contact with a second conductive layer of the printed circuit board, to determine a second conductive location according to the second electrical signal, to obtain a second Z-coordinate information corresponding to the second conductive location;

control the drill bit to continue performing the drilling motion until the drill bit drills through the printed circuit board and obtains the through hole;

wherein the drill is further configured to, after the through hole is formed, perform the following:

control the drill bit to perform backdrilling in a location of the through hole according to a preset depth;

wherein the preset depth is a medium thickness between the second conductive layer and the first conductive layer plus a compensation depth, wherein the medium thickness is obtained by calculating an absolute value of a difference between the first Z-coordinate information and the second Z-coordinate information, wherein the through hole exposes a signal layer; and wherein a sidewall of the through hole sequentially passes along the signal layer, the first conductive layer, and the second conductive layer, or the sidewall of the through hole sequentially passes along the signal layer, the second conductive layer, and the first conductive layer.

* * * * *